(12) United States Patent
Schreier

(10) Patent No.: US 7,420,494 B1
(45) Date of Patent: Sep. 2, 2008

(54) MISMATCH SHAPING Δ-Σ ANALOG TO DIGITAL CONVERTER SYSTEM

(75) Inventor: Richard E. Schreier, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 3 days.

(21) Appl. No.: 11/799,365

(22) Filed: Apr. 30, 2007

(51) Int. Cl.
*H03M 3/00* (2006.01)

(52) U.S. Cl. .................... 341/143; 341/155
(58) Field of Classification Search ............ 341/143, 341/155, 144
See application file for complete search history.

(56) References Cited

U.S. PATENT DOCUMENTS

| | | | |
|---|---|---|---|
| 4,864,640 A * | 9/1989 | Roza | 455/260 |
| 5,138,317 A | 8/1992 | Story | |
| 5,170,135 A * | 12/1992 | Ito et al. | 331/1 A |
| 5,221,926 A | 6/1993 | Jackson | |
| 5,384,551 A * | 1/1995 | Kennedy et al. | 331/17 |
| 5,404,142 A | 4/1995 | Adams et al. | |
| 5,559,474 A * | 9/1996 | Matsumoto et al. | 331/17 |
| 5,686,865 A * | 11/1997 | Takeuchi | 331/14 |
| 6,064,871 A * | 5/2000 | Leung | 455/323 |
| 6,313,775 B1 * | 11/2001 | Lindfors et al. | 341/143 |
| 6,473,019 B1 * | 10/2002 | Ruha et al. | 341/143 |
| 6,584,157 B1 * | 6/2003 | Van Der Zwan et al. | 375/247 |
| 6,816,103 B2 | 11/2004 | Jonsson et al. | |
| 7,236,113 B1 * | 6/2007 | Wang | 341/143 |

OTHER PUBLICATIONS

L. Luh et al., "A 4-GHz 4$^{th}$ -Order Passive LC Bandpass ΔΣ Modulator with IF at 1.4GHz," 2006 Symposium on VLSI Circuits, Digest of Technical Papers. pp. 168-169, Jun. 15-17, 2006.
R. Adams, "Unusual applications of the noise-shaping principle," MEAD Lecture, slides 41-43, Mar. 31, 2006.
W. Redman-White and D.J.L. Bourner, "Improved dynamic linearity in multi-level Σ-Δ converters by spectral dispersion of D/A distortion products," *IEE Conference Publication European Conference on Circuit Theory and Design*, pp. 205-208, Sep. 5-8, 1989.
B.H. Leung and S. Sutarja, "Multi-bit Σ-Δ A/D converter incorporating a novel class of dynamic element matching techniques," *IEEE Transactions on Circuits and Systems II*, vol. 39, No. 1, pp. 35-51, Jan. 1992.

(Continued)

*Primary Examiner*—Peguy JeanPierre
(74) *Attorney, Agent, or Firm*—Iandiorio Teska & Coleman

(57) ABSTRACT

A mismatch shaping ΔΣ analog to digital converter system includes a plurality of internal ΔΣ analog to digital submodulators to provide an output; a feedback circuit including a feedback digital to analog converter responsive to the output; a summing circuit for providing the difference of an analog input and the output of the feedback circuit; and a loop filter responsive to the summing circuit and having a plurality of stages, the last stage of which is distributed to and functions as a loop filter stage in each of the plurality of analog to digital submodulators for attenuating the mismatch noise of the feedback digital to analog converter in the pass band of the ΔΣ analog to digital converter system.

15 Claims, 8 Drawing Sheets

OTHER PUBLICATIONS

R.T. Baird and T.S. Fiez, "Linearity enhancement of Multibit ΔΣ A/D and D/A converters using data weighted averaging," *IEEE Transactions on Circuits and Systems II*, vol. 42, No. 12, pp. 753-762, Dec. 1995.

R. Schreier and B. Zhang, "Noise-shaped multibit D/A converter employing unit elements," *Electronics Letters*, vol. 31, No. 20, pp. 1712-1713, Sep. 28, 1995.

I. Galton, "Spectral shaping of circuit errors in digital-to-analog converters," *IEEE Transactions on Circuits and Systems II*, vol. 44, pp. 808-817, Oct. 1997.

R. Schreier and G.C. Temes, "Understanding Delta-Sigma Data Converters," pp. 400 & 414, John Wiley & Sons, Hoboken, NJ, 2005.

T. Kaplan et al., "A 2-GS/s 3-Bit ΔΣ-Modulated DAC with Tunable Bandpass Mismatch Shaping," *IEEE Journal of Solid State Circuits*, vol. 40, No. 3, pp. 603-610, Mar. 2005.

* cited by examiner

MISMATCH SHAPING Δ-Σ ANALOG TO DIGITAL CONVERTER SYSTEM

FIELD OF THE INVENTION

A mismatch shaping ΔΣ analog to digital converter system.

BACKGROUND OF THE INVENTION

Delta-sigma (ΔΣ) analog-to-digital converters (ADCs) and digital-to-analog converters (DACs) are widely used for high-fidelity conversion of analog signals into digital form and vice versa. Single-bit ΔΣ ADCs and DACs are known to have a high degree of linearity owing to the inherent linearity of a single-bit DAC. On the other hand multi-bit ΔΣ ADCs and DACs are capable of greater resolution and/or bandwidth than their single-bit counterparts. In order to address the problem of linearity in a multi-bit DAC, mismatch-shaping is often used to attenuate the mismatch-induced errors of the DAC in the frequency bands of interest. Various forms of mismatch-shaping have been proposed, but in the context of a ΔΣ ADC all these schemes limit the maximum clock rate of the ADC. It would be desirable to have an ADC architecture which provides mismatch-shaping of arbitrary order and shape, while also removing the speed limitation of other schemes. In one conventional approach a ΔΣ ADC with mismatch-shaping includes, an element selection logic (ESL) block that converts the output of the internal ADC into unary-coded data consisting of M 1-bit digital signals which drive the feedback DAC. The purpose of the ESL block is to ensure that mismatch in the feedback DAC results in shaped noise. Unfortunately, the selection, or shuffling, operation increases the interval of time between when quantization is complete and when feedback can be applied to the loop filter, and this delay limits the clock frequency of the system. In another approach dynamically re-ordering the reference levels in the internal flash ADC such that it produces shuffled unary-coded data helps somewhat, but it is now the settling time of the reference levels which restricts the minimum clock period. The shuffle-code generator can be implemented entirely in digital form using hardware which mimics the element selection logic, or it can make use of analog hardware which essentially contains M 1-bit ΔΣ modulators.

Both of these approaches of mismatch-shaping restrict the clock period. In the case where shuffling is performed by digital circuitry in the feedback path, the delay of the shuffler plus the time allocated for quantization and DAC setup equals the minimum clock period. If shuffling of the reference levels is used, the minimum clock period equals the settling time of the shuffler (including the time needed for computing the new shuffling code) plus the time allocated for quantization. Furthermore, when digital logic is used to determine the shuffling code, only simple shaping schemes (such as first-order low-pass and its N-path derivatives) are convenient to implement. Using analog ΔΣ modulators to supply the shuffle code in reference-level shuffling removes this restriction, but requires the use of extra analog circuitry which does not aid in the shaping of quantization noise. In yet another approach shaping results are achieved with 1-bit feedback applied to a split and replicated front end. In addition to having the disadvantage of 1-bit feedback to the critical first stage, this arrangement requires a lot of routing and does not support arbitrary shaping.

BRIEF SUMMARY OF THE INVENTION

It is therefore an object of this invention to provide an improved mismatch shaping ΔΣ analog to digital converter system.

It is a further object of this invention to provide such an improved mismatch shaping ΔΣ analog to digital converter system which can operate at higher speed.

It is a further object of this invention to provide such an improved mismatch shaping ΔΣ analog to digital converter system which eliminates shuffling operations from the critical feedback path from internal ADC to feedback DAC.

It is a further object of this invention to provide such an improved mismatch shaping ΔΣ analog to digital converter system which supports more general forms of mismatch shaping e.g. first and higher order, low pass, band pass, complex.

It is a further object of this invention to provide such an improved mismatch shaping ΔΣ analog to digital converter system in which the mismatch shaping circuitry is inside the loop filter and so contributes to shaping of the quantization noise.

The invention results from the realization that a truly improved, faster mismatch shaping ΔΣ ADC system can be achieved using a parallel back end in which the internal quantization ΔΣ ADC modulator includes a plurality of ΔΣ AD submodulators and the loop filter includes a last stage which is distributed to and functions as a loop filter stage in each of the submodulators invoking the inherent property of the ΔΣ AD submodulators of producing digital signals with controlled spectral shape resulting in the mismatch errors in the feedback DAC having spectral shape so that errors caused by that mismatch are attenuated in the pass band of interest.

The subject invention, however, in other embodiments, need not achieve all these objectives and the claims hereof should not be limited to structures or methods capable of achieving these objectives.

This invention features a mismatch shaping ΔΣ analog to digital converter system including a plurality of internal analog to digital submodulators to provide an output and a feedback circuit including a feedback digital to analog converter responsive to the output. There is a summing circuit for providing the difference of an analog input and the output of the feedback circuit. A loop filter is responsive to the summing circuit and has a plurality of stages, the last stage of which is distributed to and functions as a loop filter stage in each of the plurality of analog to digital submodulators for attenuating the mismatch noise of the feedback digital to analog converters in the pass band of the ΔΣ analog to digital converter system.

In a preferred embodiment there may be a dither source for decorrelating the operation of the analog to digital submodulators. Each analog to digital submodulator may include a quantizer circuit and the dither source may be applied to the quantizer circuit. The dither source may be applied to the input of the quantizer circuit. It may be provided to the reference circuit of the quantizer circuit. The submodulators may be single bit modulators having an output alphabet of ±1. The submodulators may be tri-level modulators having an output alphabet of ±1, 0. The submodulators may be complex 4-level modulators having an output alphabet of ±1, ±j. The submodulators may be complex 5-level modulators having an output alphabet of ±1, ±j. 0. The loop filter may include a splitter circuit for dividing the output signal from the previous loop filter stage among the distributed last stage in the submodulators. The submodulators may be substantially identical. Each submodulator may be a multi bit modulator. At least one of the multi bit submodulators may include a shuffling circuit. The submodulators may be arranged hierarchically in a number of ΔΣ interim modulators each including at least two lower lever submodulators. The loop filter may have a distributed penultimate stage distributed to and functioning as a loop filter stage in each of the ΔΣ interim modulators.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
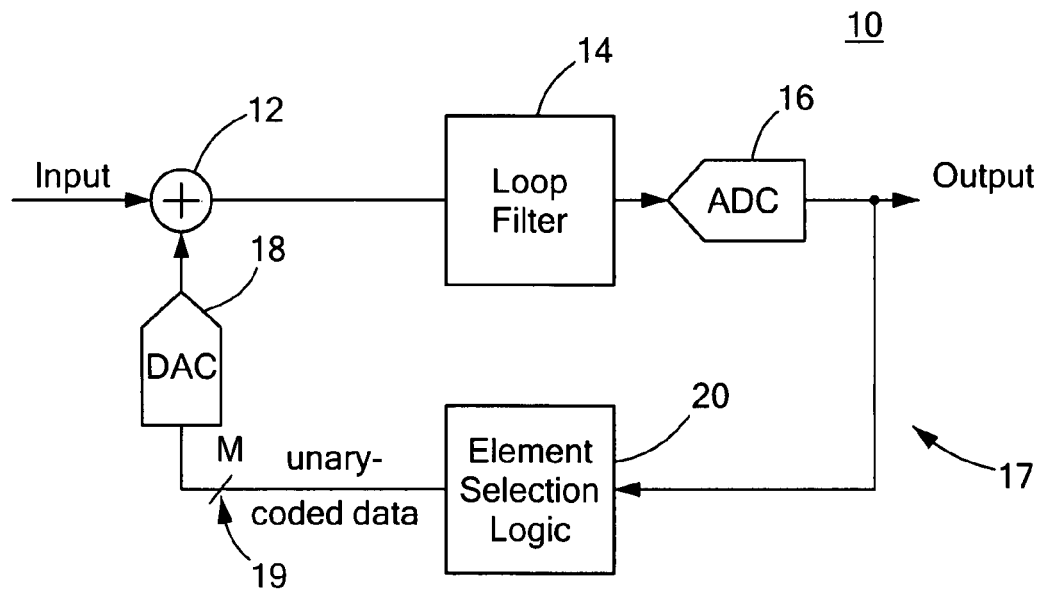
FIG. 1 is a schematic diagram of a prior art ΔΣ ADC with digital mismatch shaping.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art ΔΣ ADC 10 with mismatch shaping. ΔΣ ADC 10 contains conventional components including input summer 12, loop filter 14, internal ADC or quantizer 16, and feedback DAC 18. Also included is an element selection logic 20 which converts the output of the internal ADC 16 into unary coded data consisting of M one bit digital signals in feedback circuit 17 which drives feedback DAC 18. The element selection logic 20 ensures that the mismatch in the feedback DAC 18 results in shaped noise. However, the selection or shuffling operation effected by element selection logic 20 increases the interval of time between when quantization is complete and when feedback can be applied to the loop filter 14. This delay limits the clock frequency of the system. Feedback circuit 17 includes feedback line 19 connected from the output of element selection logic 20 to feedback DAC 18.

Figure 2:
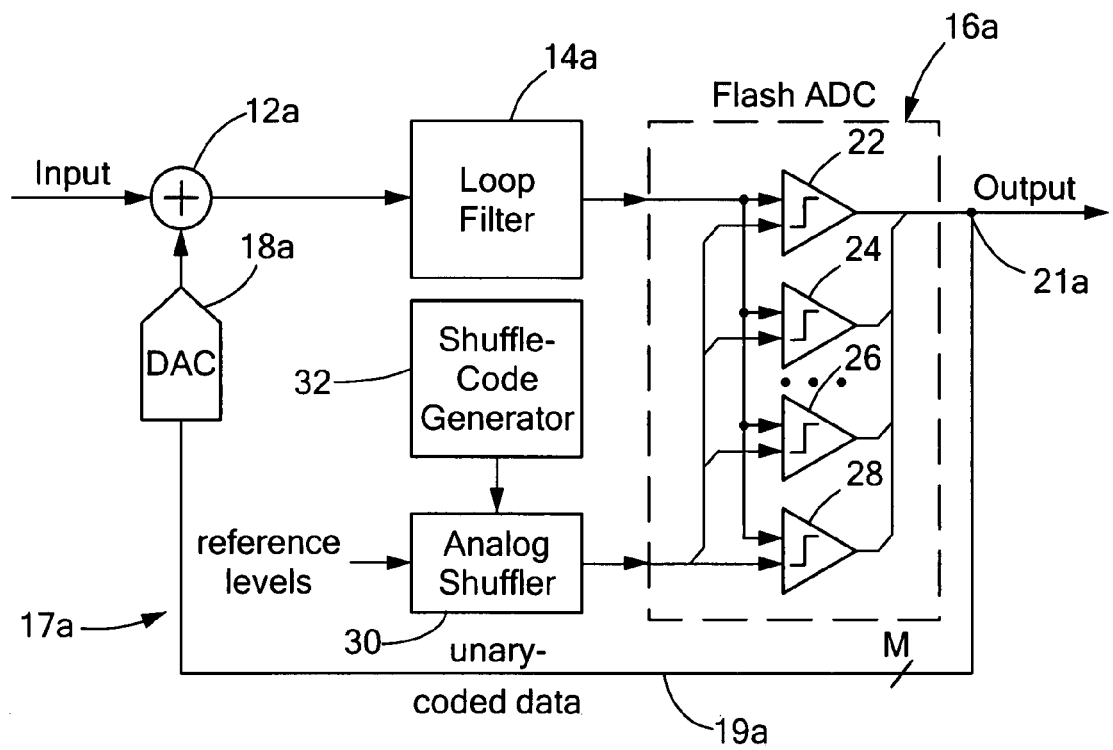
FIG. 2 is a schematic diagram of another prior art ΔΣ ADC with digital mismatching shaping implemented by shuffling of the reference levels.

In another prior art approach, FIG. 2, the internal ADC or quantizer 16a is implemented with a flash ADC which includes M quantizer circuits, such as comparators 22, 24, 26 and 28. Reference levels applied to comparators 22-28 are supplied from analog shuffler 30 which shuffles the order of the application of the references to comparators 22-28 under control of the shuffle code generator 32 so that the flash ADC produces shuffled unary coded data on feedback circuit 19a.

In accordance with this invention the proposed architecture removes all shuffling-delay restrictions, supports all forms of mismatch shaping (first- and higher-order lowpass/bandpass/complex) and furthermore the mismatch-shaping circuitry also contributes to the shaping of quantization noise. The architecture amounts to splitting the backend stage(s) of a ΔΣ modulator's loop filter into parallel stages whose outputs are individually quantized. These separate stages provide mismatch-shaped data directly. Using binary quantization yields binary data streams that individually have low-order spectral shape and thereby provides mismatch tolerance. When these data streams are taken as a whole, high-order spectral shaping and consequently high performance are realized. A collection of M single-bit quantizers and their associated local feedback loops are attached to a main loop filter in a global feedback loop. The idea is that each quantizer is part of a low-order ΔΣ modulator and so inherently outputs a sequence with spectral shape. The global loop allows these modulators to work in concert to achieve high-order shaping with multi-bit quantization when all the back end outputs are summed. Since each quantizer is connected directly to a dedicated element in each multi-bit feedback DAC, all encoding/decoding/shuffling operations are eliminated from the critical feedback path. With this arrangement, the speed of the critical path is determined by the speed with which single-bit data can be generated in a comparator and fed to a 1-bit DAC.

Figure 3:
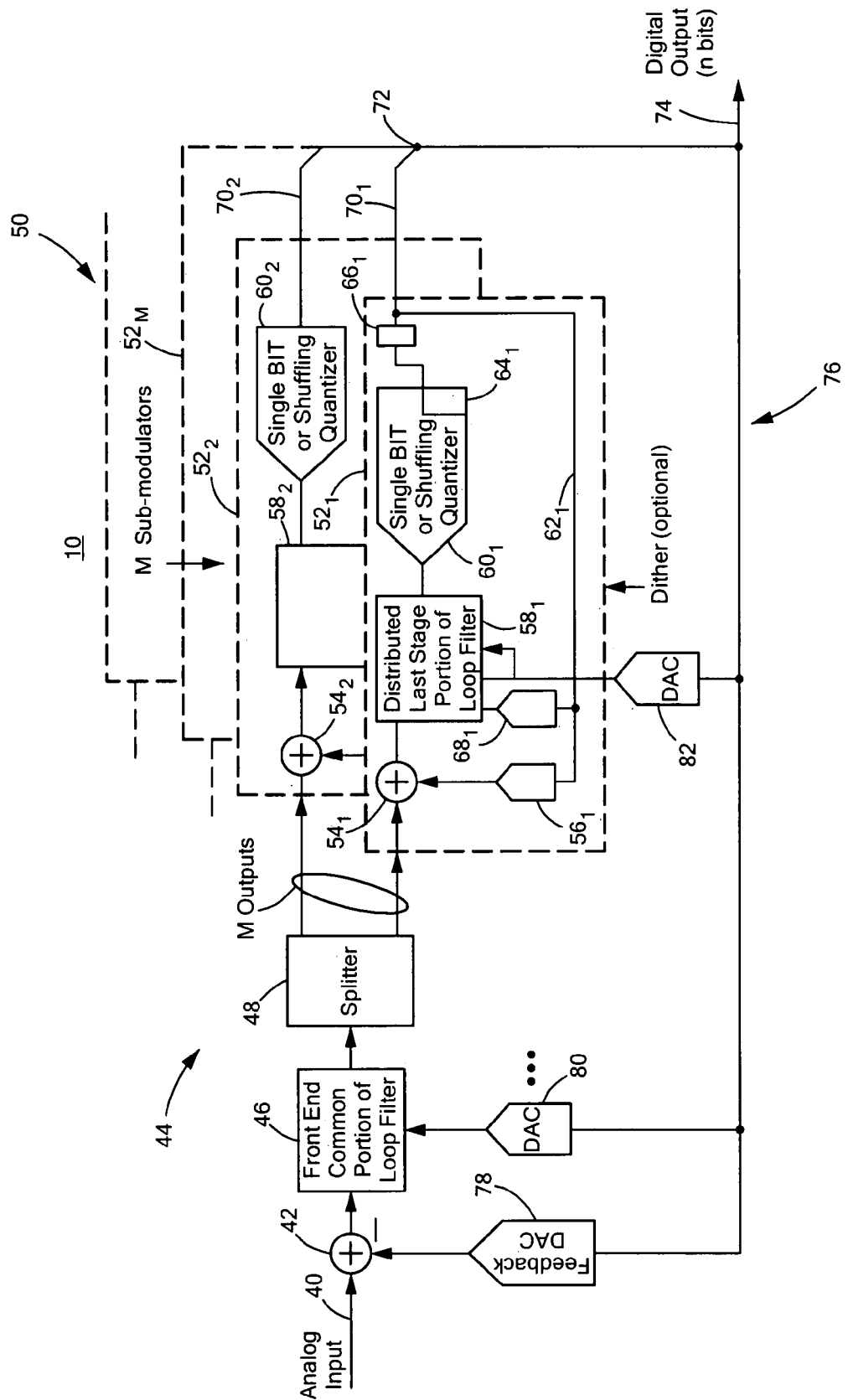
FIG. 3 is a schematic diagram of a mismatch shaping ΔΣ ADC system according to this invention.

There is shown in FIG. 3 a mismatch shaping ΔΣ ADC system 10 according to this invention which receives an analog input 40 at summing circuit 42 whose output is delivered to loop filter 44. In this invention loop filter 44 includes a front end common portion of the loop filter 46, and a splitter 48. The parallel back end includes in the internal or quantizer ADC 50 a plurality M of submodulators $52_1, 52_2, \ldots 52_M$.

Each submodulator as exemplified by submodulator $52_1$ includes an input summing circuit $54_1$, feedback DAC $56_1$, distributed last stage portion $58_1$ of the loop filter and internal or quantizing ADC $60_1$. Quantizer $60_1$ may itself be a standard single bit quantizer or may be a multi-bit quantizer, with or without shuffling.

If the inherent inequalities between the submodulators $52_1$-$52_M$ are not sufficient, a dither signal may be input to each submodulator $52_1$-$52_M$ in order to decorrelate the operation of the submodulators. Each submodulator also includes its own feedback circuit $62_1$. The shuffling quantizer $64_1$ may be internal to quantizer ADC $60_1$ or the shuffling circuit may be external to it $66_1$. Additional feedack DACs $68_1$ may be provided in feedback circuit $62_1$ for the distributed last stage portion $58_1$ of the loop filter 44. The outputs $70_1, 70_2, \ldots 70_M$, may be combined as at 72 to provide a digital output 74 of n bits and provide the input to global feedback circuit 76. Global feedback circuit 76 in addition to the main feedback DAC 78 may include additional feedback DACs 80 for each stage in the front end common portion 46 of loop filter 44 and DAC 82 for providing feedback to the distributed last stage portion $58_1$ of loop filter 44. M is the number of submodulators 52 in quantizer or internal ADC 50 and splitter 48 divides its input into M outputs. Typically but not necessarily the M outputs may be substantially equal as applied to each of the M submodulators $52_1$-$52_M$. The distributed stage has a number of sections equal to M where M is the number of outputs of splitter 48 and a number of submodulators $52_1$-$52_M$ in quantizer 50.

Figure 4:
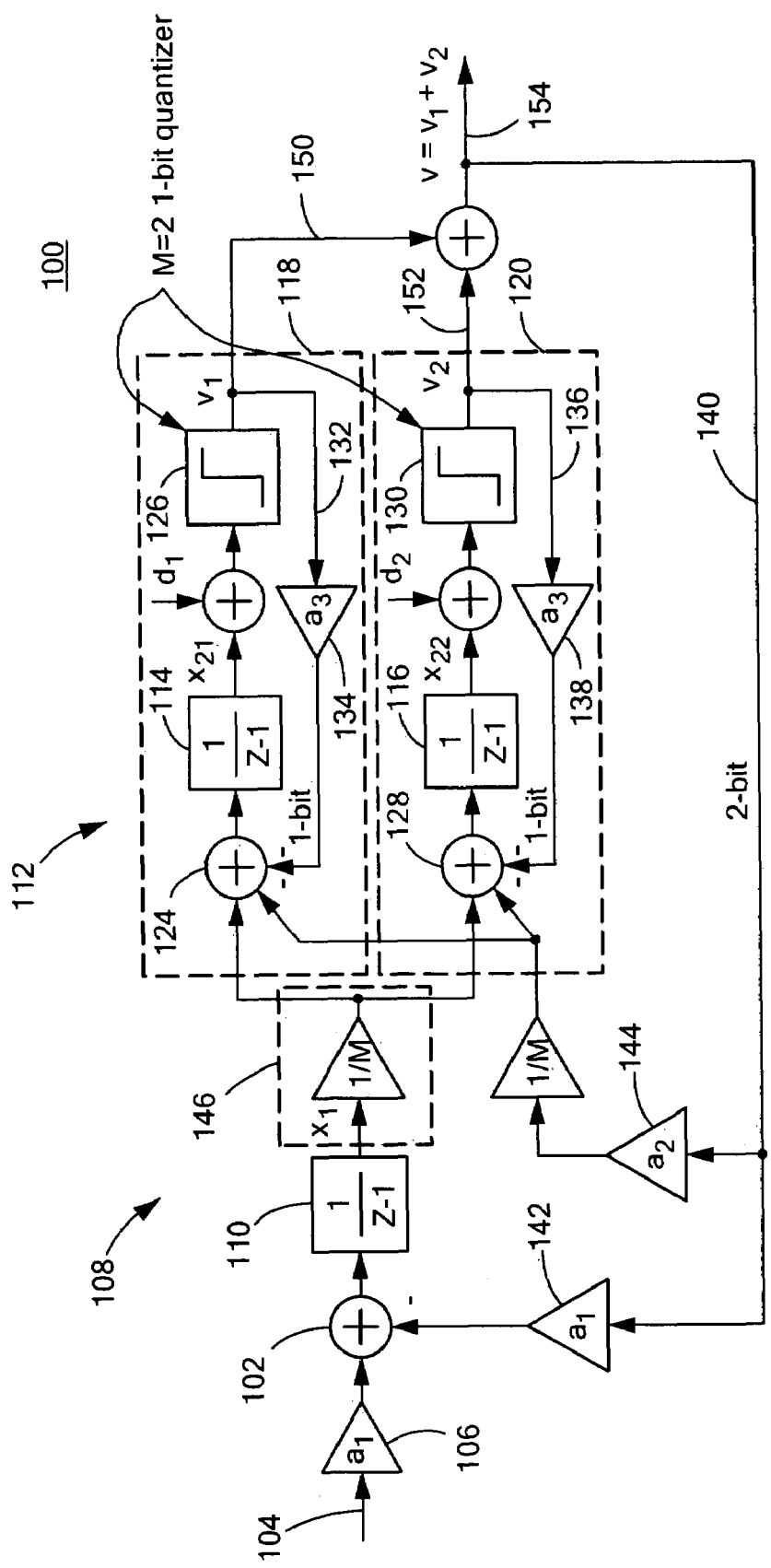
FIG. 4 is a schematic diagram of second order mismatch shaping ΔΣ ADC system according to this invention.

A second order mismatch shaping ΔΣ analog to digital converter system 100, FIG. 4, according to this invention includes an input summing circuit 102 for receiving an analog input 104 with a weighting factor $a_1$, set by circuit 106, which may be a resistor in a continuos time implementation, or a switched capacitor branch in a discrete time implementation. Here loop filter 108 includes two stages. A first stage 110 which is a delaying discrete—time integrator and a second and last stage 112 which is distributed in two sections 114, 116, each of which is a delaying discrete—time integrator. Sections 114, 116 of second stage 112 also form a part of and function as the loop filters in submodulators 118 and 120. Submodulator 118 includes an input summer 124, integrator stage section 114 and quantizer circuit 126. Submodulator 120 includes summing circuit 128, integrator stage section 116 and quantizer circuit 130. Submodulator 118 has a feedback circuit 132 including feedback DAC 134 and submodulator 120 has feedback circuit 136 including feedback DAC 138. The global feedback circuit 140 includes the primary feedback DAC 142 which provides the differencing input to summing circuit 102 and an additional feedback DAC 144 which provides global feedback to summing circuits 124 and 128. Here there are M submodulators where M=2 and so splitter 146 provides M or two outputs from its previous stage 110 to each of the sections 114, 116 of the distributed stage 112. The outputs $v_1$ 150 and $v_2$ 152 are each one bit outputs from one bit quantizers 126 and 130, respectively. The global output 154 v is equal to the combination $v_1$ plus $v_2$. The local feedback circuit 132 and 136 are each one bit while the global feedback circuit 140 carries the sum or two bits. Dither may be applied as explained previously. For example, dither $d_1$ may be applied at the input to quantizer 126. Similarly dither $d_2$ may be provided at the input of quantizer 130. Although the feedback DACs 134, 138, 142, and 144 are shown as amplifiers having coefficients of $a_1$, $a_2$, and $a_3$ where $a_1$ equals ⅛, $a_2$ equals ¼, $a_3$ equals ½, this is for convenience of illustration. Circuits 134, 138, 142 and 144 would most likely be DACs which implement weights of $a_1$, $a_2$, and $a_3$.

The values of the ($a_1$, $a_2$, $a_3$) coefficients can be determined as follows. For the sake of illustration, assume that the following first-order mismatch transfer function $$MTF = H(z) = \frac{z-1}{z-0.5} \quad (1)$$

and the following second-order noise transfer function $$NTF = H(z)^2 \quad (2)$$

are to be implemented using the structure of FIG. 4.

The key to the procedure is to regard the back end as containing states whose sum equals the states of a regular modulator which implements the NTF, while their differences correspond to a modulator which implements the MTF. This method totally decouples the MTF from the NTF: the MTF can be of any order and even need not have the same zeros as the NTF. In the context of this simple example, however, the MTF and the NTF share a zero at z=1.

Figure 4A:
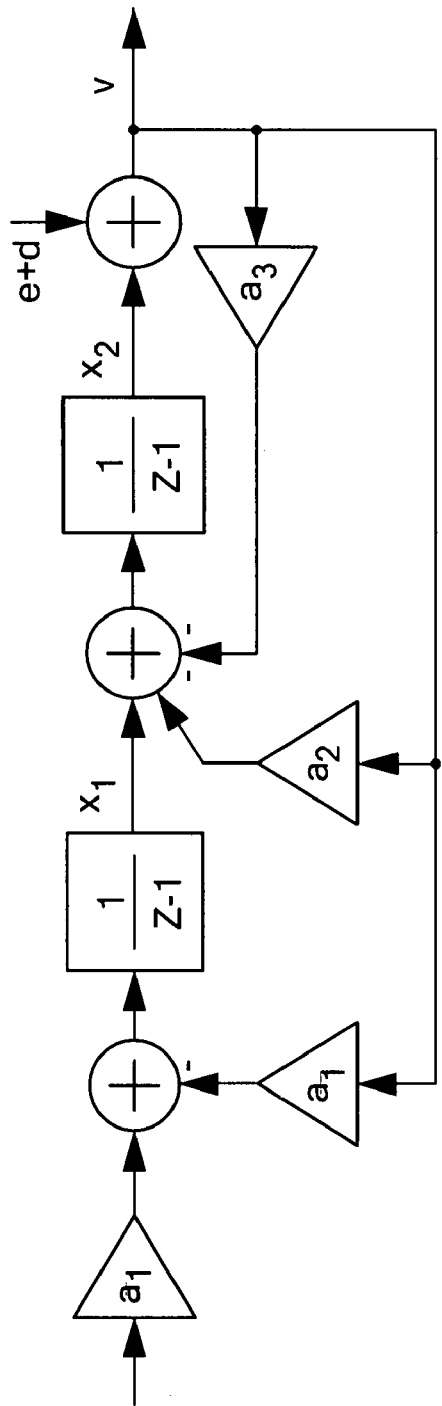
FIG. 4A shows the sum form of the system in FIG. 4.

Applying this idea to the system at hand reduces the back-end to a single stage whose state is the sum of the states of the parallel back-end: $x_2 = x_{21} + x_{22}$. Since $v = v_1 + v_2$, the output of the reduced system is again simply the sum of the outputs of the individual parallel stages. The system diagram corresponding to the reduced system is depicted in FIG. 4A, wherein the two internal quantizers and associated dither have been replaced by their linear equivalents, namely addition of error e and dither d. Note that the 1/M factors associated with the input paths to the parallel back end disappear in the reduced version of the back-end, since M such paths are summed to yield the reduced back-end.

The system of FIG. 4A is essentially a standard second-order CIFB (cascade-of-integrators-feedback) structure, for which the coefficient calculation procedure is well-known. In this system, the effective feedback coefficients are $a_1$ and $a_2 + a_3$, and these are simply equated to the coefficients required to realize the NTF specified in Eq. (2). Using the ΔΣ toolbox, see R. Schreier and G. C. Temes, Understanding Delta-Sigma Data Converters, John Wiley & Sons, Hoboken, N.J., 2005.

the required feedback coefficients are found to be 0.25 and 1, and thus $$a_1 = 0.25 \quad (3)$$

$$a_2 + a_3 = 1 \quad (4)$$

Figure 4B:
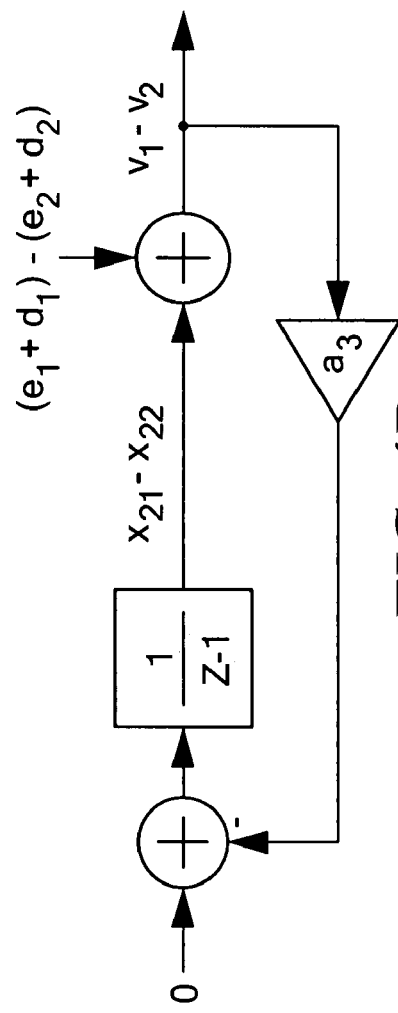
FIG. 4B shows the difference form of the system in FIG. 4.

As long as Eq. (3) and Eq. (4) are satisfied, the NTF will be that given by Eq. (2). In order to realize the MTF specified in Eq. (1), consider now the conceptual system corresponding to the difference between the two backend stages. In this reduction step, paths that are common to both stages, for example the input from the splitter 146 and the global feedback path 144, cancel out. The reduced system is now as depicted in FIG. 4B, which is a standard first-order modulator with zero input and a feedback coefficient $a_3$. Using the ΔΣ toolbox, the feedback coefficient required to implement the MTF of Eq. (1) is found to be 0.5, and thus $$a_3 = 0.5 \quad (5)$$

from Eq. (4), $$a_2 = 0.5 \quad (6)$$

Figure 5:
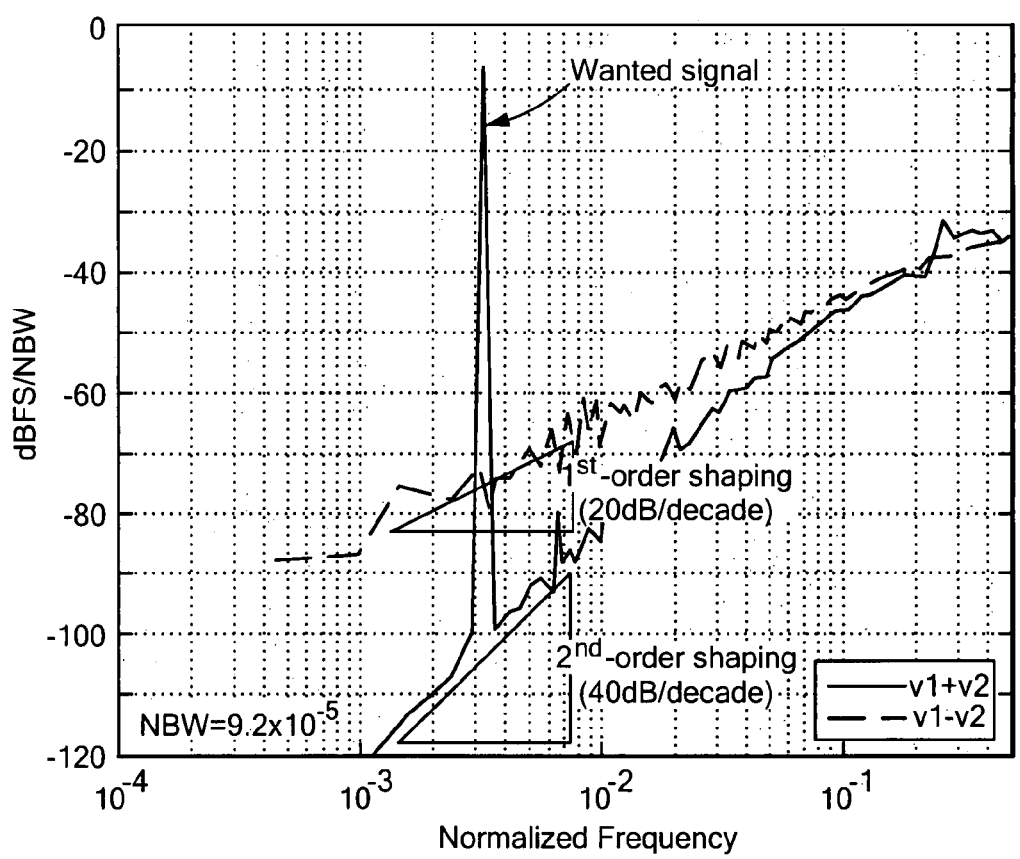
FIG. 5 shows simulated spectra for the system of FIG. 4.

Using the ΔΣ toolbox to simulate this system yields the spectra shown in FIG. 5. Dither of amplitude 0.1 was added to each quantizer. As intended, the sum output ($v_1 + v_2$) contains the signal plus second-order shaped noise having a 40 dB/decade slope, while the difference output ($v_1 - v_2$) is simply first-order shaped noise with a slope of 20 dB/decade. Mismatch in the first feedback DAC would therefore manifest itself as a small amount of first-order shaped noise added to the ideal output.

The coefficients calculated using this procedure yield what is known as an unscaled modulator. As is standard practice, dynamic range scaling is needed to yield state swings which are practical. This scaling operation may change every coefficient, including the implicit unity inter-stage coefficients, but leaves the overall topology as well as the input-output behavior of the system unchanged. Consequently, the invention is not to be limited to the specific set of coefficients given here.

Figure 6:
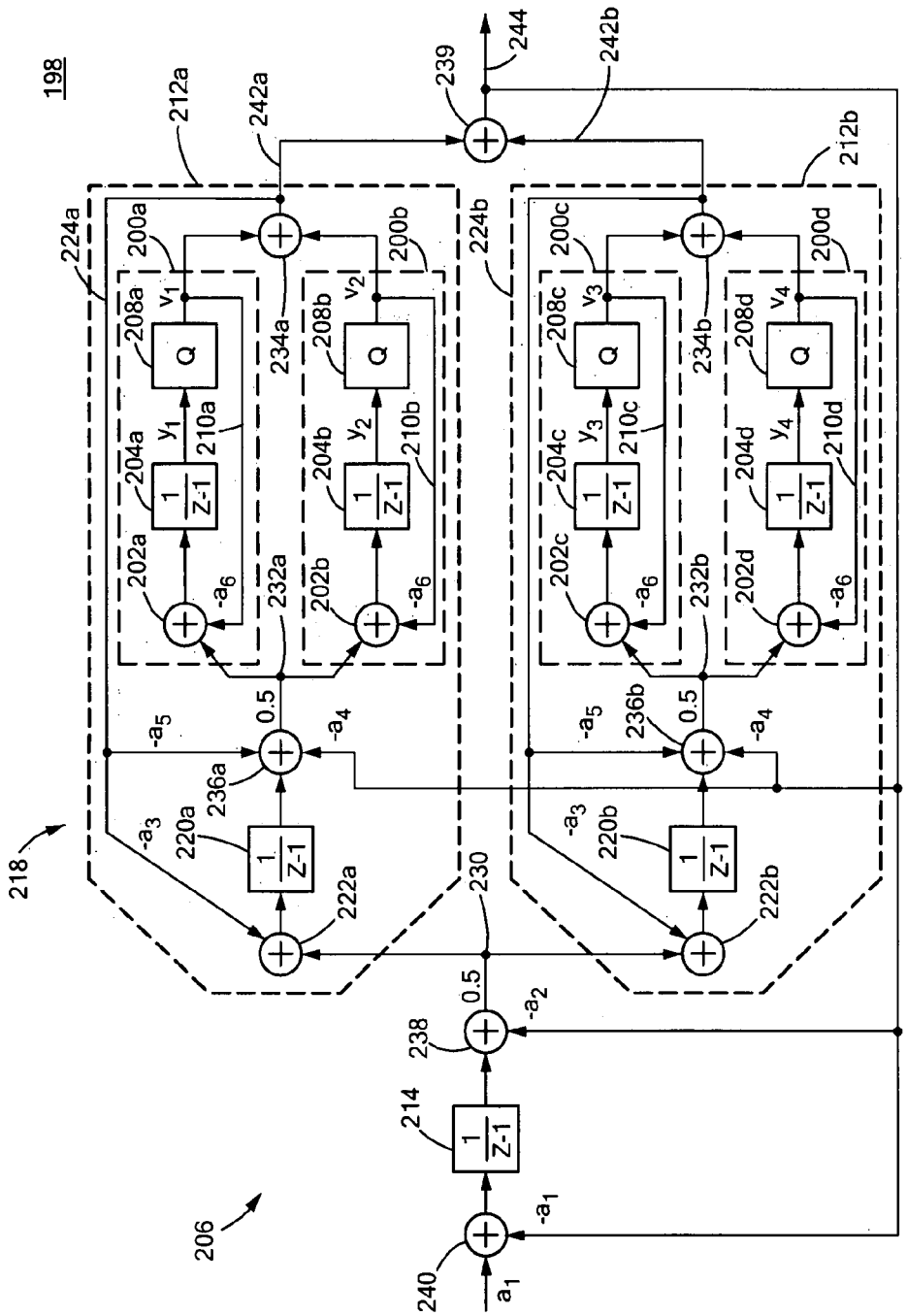
FIG. 6 is a schematic diagram of third order mismatch shaping ΔΣ ADC system according to this invention.

A third-order hierarchical mismatch shaping ΔΣ analog to digital converter system 198, FIG. 6, is shown including M=4 1st order submodulators 200a, 200b, 200c, 200d arranged hierarchically into two interim $2^{nd}$ order modulators 212a-b which are in turn part of the overall $3^{rd}$ order modulator 198. Each of the 4 lower-level submodulators includes an input summing circuit 202a-d, a section 204a-d of the last distributed stage of loop filter 206 and an internal ADC or quantizer circuit 208a-d. There is a conventional feedback circuit 210a-d with a feedback DAC not shown but represented by the coefficient or DAC weight $a_6$. In FIG. 6, the submodulators 200a, b, c, d, are configured into two ΔΣ interim modulators 212a and 212b each including two submodulators (200a, 200b); and (200c, 200d), respectively. The loop filter 206 then, in addition to the front end common portion 214, has distributed sections 204a, b, c, d of the distributed last stage 216, but it also has a distributed penultimate or next to the last stage 218 including sections 220a, and 220b which serve each of the interim modulators 212a and 212b, respectively. Interim modulators 212a and 212b each have an input summer circuit 222a, 222b and their own feedback circuits 224a and 224b. There are now multiple splitters 230, 232a, 232b, as well as additional summing circuits 234a, 234b, associated with submodulators 200a, 200b, and modulators 200c, 200d and summing circuits 236a, 236b, and 238, 239 as well as input summing circuit 240.

The DACs which would normally be explicit in FIG. 6 are represented by the coefficients $a_1, a_2, a_3, a_4, a_5, a_6$. Each of the submodulator 200a, b, c, d, outputs $v_1, v_2, v_3, v_4$, respectively, are combined so that the outputs 242a and 242b of interim modulators 212a and 212b are $v_1$ plus $v_2$ and $v_3$ plus $v_4$, respectively, and the global output 244 is $v_1$ plus $v_2$ plus $v_3$ plus $v_4$. If, as previously, quantizer ADCs 208a, b, c, d, are one bit quantizers then the interim modulator outputs will be two bit and the global output 244 will be four bit. In the system of FIG. 6 each quantizer is connected in a first order loop. Pairs of quantizers are connected in second order loop while all four quantizers together form a third order loop. This architecture can be extended to higher orders. The order of each minor loop and the number of quantizers grouped together are a matter of design choice. The additional degrees of freedom in the global loop allows for more aggressive mismatch shaping.

The values of the $(a_1, a_2, a_3, a_4, a_5, a_6)$ coefficients can be determined as follows. The procedure is similar to that described in the context of the second-order example, except that now there are three levels of hierarchy and six unknown coefficients.

At the top level of hierarchy, all parallel stages are summed and the modulator is a standard third-order CIFB system with feedback coefficients $(a_1, a_2+a_3, a_4+a_5+a_6)$. Since this modulator implements the NTF, values for the three feedback coefficients are readily determined. For example, if the desired NTF is $NTF=H(z)^3$, where $H(z)$ is as defined previously, then the required coefficients are (0.125, 0.75, 1.5) and we have three equations involving the unknown coefficients.

At the next level of hierarchy, the mismatch between pairs of outputs is controlled by a mismatch transfer function $MTF_2$. $MTF_2$ is obtained by considering the difference system which results from subtracting corresponding signals in the interim submodulators 212a and 212b. This mid-level system is a standard second-order CIFB system with feedback coefficients $(a_3, a_5, +a_6)$. Once again, the values of these two coefficients are readily determined. If, $MTF_2=H(z)^2$, then the coefficients are (0.25, 1) as in the preceding example. We now have a total of five equations involving the six unknowns.

The final equation is derived from the requirement that the difference system which results from subtracting corresponding signals in the lowest-level modulators 200a and 200b must implement a mismatch transfer function $MTF_1$. This final difference system is first-order CIFB system with feedback coefficient $a_6$. Taking $MTF_1=H(z)$ yields $a_6=0.5$ and thus we have six equations in six unknowns. Solving these equations yields $$(a_1, a_2, a_3, a_4, a_5, a_6)=(0.125, 0.5, 0.25, 0.5, 0.5, 0.5) \quad (7)$$

As in the preceding example, these coefficients have not been subject to dynamic range scaling, and further calculations are needed to obtain a full set of coefficients which restrict the signal swings to specified ranges.

Figure 7:
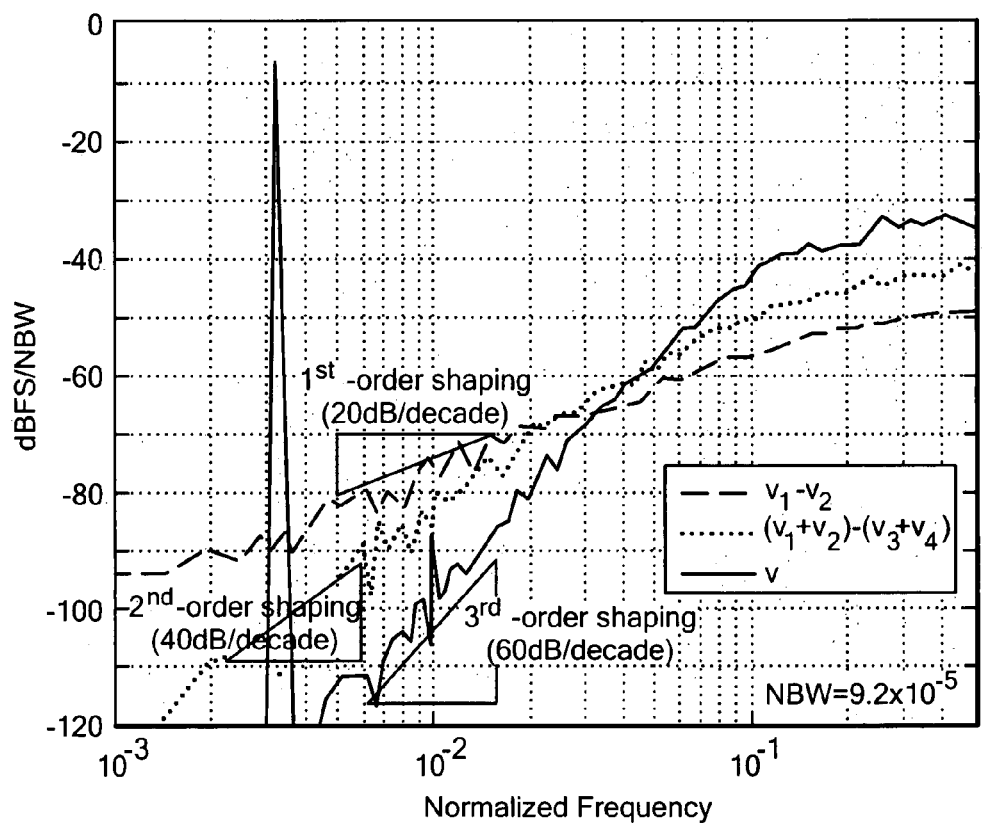
FIG. 7 shows simulated spectra for the system of FIG. 6.

FIG. 7 shows the simulated spectra for this system when 1-bit quantizers and a dither amplitude of 0.1 are used. The shaping of the differences of individual data streams, the difference of data-stream pairs and the sum of all data streams follow the expected transfer functions, namely first-order, second-order and third-order transfer functions respectively.

The embodiment disclosed herein suggests a number of variations. More than three levels of hierarchy may be used. More than two parallel stages may be used at any level in the hierarchy. Different MTFs may be used in the submodulators. For example, by allowing the $a_6$ coefficient of submodulators 200a and 200b to differ from the coefficient of the same name in submodulators 200c and 200d, the mismatch transfer functions of the two submodulator pairs can be different. In fact, the $a_6$ coefficient of submodulator 200a need not be exactly equal to the $a_6$ coefficient of submodulator 200b.

Figure 8:
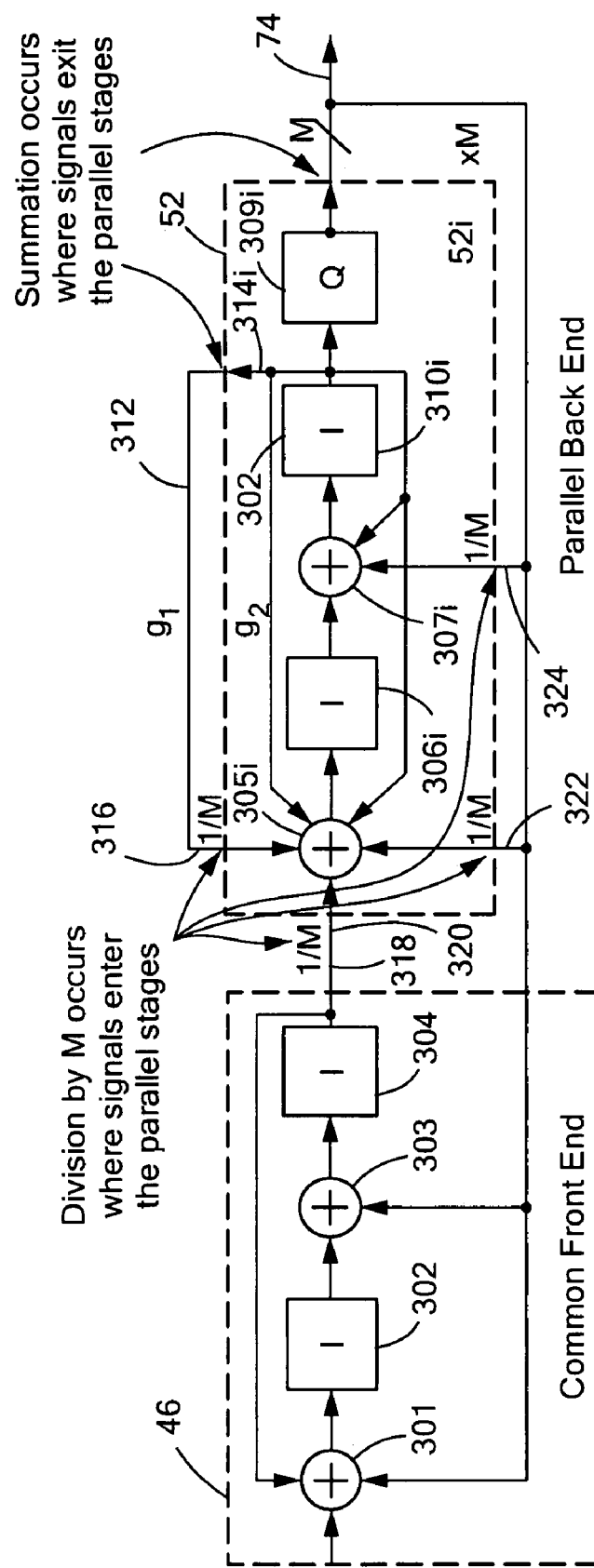
FIG. 8 illustrates a $4^{th}$ order modulator topology with $2^{nd}$ order mismatch shaping in which the zeros of the MTF are not necessarily zeros in the NTF.

The quantizers in the sub-modulators may be single-bit real (i.e. two-level quantizers having an output alphabet of $+-1$), tri-level (i.e. having an output alphabet of $0,+-1$), or, in general, any number of levels. For complex sub-modulators, the internal quantizers may be 4-level complex (i.e. having an output alphabet of $+-1,+-j$), 5-level complex (i.e. having an output alphabet of $0,+-1,+-j$), or, in general, any number of levels. In systems with more levels of hierarchy, this generalization extends to corresponding modulators throughout the hierarchy. Feedback may be provided within the loop filter to implement resonators, which yield NTF/MTF zeros at $z \neq 1$. Feedback may be used within the loop filter such that the zeros of the MTF and the NTF are independent. This requires the use of a structure such as that shown in FIG. 8. In this mismatch-shaping modulator system, local feedback with coefficient $g_2$ is implemented in the submodulators, while the effective global feedback has a coefficient $g_1+g_2$. Thus $g_2$ controls the zero of the MTF, while $g_1+g_2$ controls one of the NTF's zeros. In this illustration, the common portion 46 of the loop filter contains two integrators 302 and 304 whose inputs are supplied by summing circuits 301 and 303, respectively. The output 318 of the common portion of the loop filter is applied to the parallel backend 52. The parallel backend consists of M identical submodulators 52i which in turn consist of integrators 306i, 308i, associated summing circuits 305i, 307i, as well as quantizer 309i and internal feedback circuit 310i. The output 74 of the system consists of the M outputs of the M submodulators. As with previous systems, the mathematical representation of the global output 74 is the sum of the M outputs of the M submodulators. The sum need not be computed explicitly: in a preferred embodiment the individual outputs of the M submodulators are one-bit signals and the global output is simply these M 1-bit signals taken as a single unary-coded signal. In a similar fashion, the mathematical representation of the global signal 312 is the sum of the internal signals 314i of the submodulators and this sum also does not need to be explicit. Global signals 312, 318 and 74 enter the submodulators at 316, 320, 322 and 324, and the resulting signals which are local to the submodulators are represented mathematically as the associated global signal divided by M. With these mathematical representations, the M submodulators may be analyzed as a single submodulator whose internal states are the sums of the internal states of the individual submodulators, as in the example of the second-order system shown in FIG. 4. A complex (quadrature) loop filter may be used. Loop filter topologies other than the CIFB topology may be used.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A mismatch shaping $\Delta\Sigma$ analog to digital converter system comprising:
   a plurality of internal $\Delta\Sigma$ analog to digital submodulators to provide an output;
   a feedback circuit including a feedback digital to analog converter responsive to said output;
   a summing circuit for providing the difference of an analog input and the output of said feedback circuit; and
   a loop filter responsive to said summing circuit and having a plurality of stages, the last stage of which is distributed to and functions as a loop filter stage in each of said plurality of analog to digital submodulators for attenuating the mismatch noise of said feedback digital to analog converter in the pass band of the $\Delta\Sigma$ analog to digital converter system.

2. The mismatch shaping $\Delta\Sigma$ analog to digital converter system of claim 1 further including a dither source for decorrelating operation of said analog to digital submodulators.

3. The mismatch shaping $\Delta\Sigma$ analog to digital converter system of claim 2 in which each said analog to digital submodulator includes a quantizer circuit and said dither source is applied to said quantizer circuit.

4. The mismatch shaping $\Delta\Sigma$ analog to digital converter system of claim 3 in which said dither source is applied to the input of said quantizer circuit.

5. The mismatch shaping $\Delta\Sigma$ analog to digital converter system of claim 3 in which said dither source is applied to the reference terminal of said quantizer circuit.

6. The mismatch shaping $\Delta\Sigma$ analog to digital converter system of claim 1 in which said submodulators are single bit modulators having an output alphabet of $\pm 1$.

7. The mismatch shaping $\Delta\Sigma$ analog to digital converter system of claim 1 in which said submodulators are tri-level modulators having an output alphabet of $\pm 1, 0$.

8. The mismatch shaping $\Delta\Sigma$ analog to digital converter system of claim 1 in which said submodulators are complex 4-level modulators having an output alphabet of $\pm 1, \pm j$.

9. The mismatch shaping $\Delta\Sigma$ analog to digital converter system of claim 1 in which said submodulators are complex 5-level modulators having an output alphabet of $\pm 1, \pm j, 0$.

10. The mismatch shaping $\Delta\Sigma$ analog to digital converter system of claim 1 in which said loop filter includes a splitter circuit for dividing the output signal from the front end common portion of the loop filter among the distributed last stage in said submodulators.

11. The mismatch shaping $\Delta\Sigma$ analog to digital converter system of claim 1 in which said submodulators are substantially identical.

12. The mismatch shaping $\Delta\Sigma$ analog to digital converter system of claim 1 in which each submodulator is a multi-bit modulator.

13. The mismatch shaping $\Delta\Sigma$ analog to digital converter system of claim 12 in which at least one of said multi-bit submodulators includes a shuffling circuit.

14. The mismatch shaping $\Delta\Sigma$ analog to digital converter system of claim 1 in which said submodulators are arranged hierarchically in a number of $\Delta\Sigma$ interim modulators each including at least two lower-level submodulators.

15. The mismatch shaping $\Delta\Sigma$ analog to digital converter system of claim 14 in which said loop filter has a distributed penultimate stage distributed to and functioning as a loop filter stage in each of said $\Delta\Sigma$ interim modulators.

* * * * *